US009297859B2

(12) United States Patent
Mukaitani et al.

(10) Patent No.: US 9,297,859 B2
(45) Date of Patent: Mar. 29, 2016

(54) BATTERY-STATE MONITORING SYSTEM

(71) Applicant: Hitachi Chemical Company, Ltd., Chiyoda-ku, Tokyo (JP)

(72) Inventors: Ichiro Mukaitani, Tokyo (JP); Takashi Kofuse, Tokyo (JP); Mitsuyoshi Kanoh, Tokyo (JP); Shinya Mizusugi, Tokyo (JP); Yasuhiro Shibata, Tokyo (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 87 days.

(21) Appl. No.: 14/356,785

(22) PCT Filed: Oct. 17, 2012

(86) PCT No.: PCT/JP2012/076819
§ 371 (c)(1),
(2) Date: May 7, 2014

(87) PCT Pub. No.: WO2013/069423
PCT Pub. Date: May 16, 2013

(65) Prior Publication Data
US 2014/0285156 A1 Sep. 25, 2014

(30) Foreign Application Priority Data
Nov. 8, 2011 (JP) ................................. 2011-244569

(51) Int. Cl.
*H02J 7/00* (2006.01)
*G01N 27/416* (2006.01)
*G01R 31/36* (2006.01)

(52) U.S. Cl.
CPC ........ *G01R 31/3606* (2013.01); *G01R 31/3624* (2013.01); *G01R 31/3662* (2013.01);
(Continued)

(58) Field of Classification Search
CPC ........... G01R 31/3606; G01R 31/3624; G01R 31/3662; G01R 31/3679; H02J 7/0021; H02J 7/007

USPC ................... 320/134, 136; 324/426, 430, 434
See application file for complete search history.

(56) References Cited

U.S. PATENT DOCUMENTS 6,094,031 A 7/2000 Shimane et al.
8,829,717 B2 * 9/2014 Kudo .................... H02J 7/0018
307/77
(Continued)

FOREIGN PATENT DOCUMENTS

CN 201489093 U 5/2010
CN 102183730 A 9/2011
(Continued)

OTHER PUBLICATIONS

Japanese Office Action dated Mar. 3, 2015 (four (4) pages).
(Continued)

*Primary Examiner* — M'Baye Diao
(74) *Attorney, Agent, or Firm* — Crowell & Moring LLP

(57) ABSTRACT

A battery-state monitoring system for precisely and efficiently estimating the state and service life of each of a plurality of storage batteries while suppressing variations in voltage between the batteries in a large-scale power-supply system that is provided with the storage batteries charged with power generated by utilizing natural energy is provided. The system includes a power supply control device that detects a current in each storage battery, an end device that measures temperature, voltage, and internal resistance of each battery, the internal resistance being measured by using at least two or more kinds of frequencies, and a prime monitoring device that acquires measurement data from the end device corresponding to each battery and issues an instruction related to an operation to the power supply control device and the end device. The prime monitoring device estimates degradation of each battery based on one or more of temperature, voltage, internal resistance.

11 Claims, 5 Drawing Sheets

(52) U.S. Cl.
CPC ............. *G01R31/3679* (2013.01); *H02J 7/007* (2013.01); *H02J 7/0021* (2013.01); *G01R 31/3658* (2013.01); *G01R 31/3689* (2013.01)

(56) References Cited

U.S. PATENT DOCUMENTS

| | | | |
|---|---|---|---|
| 2004/0076872 A1 | 4/2004 | Kinoshita et al. | |
| 2007/0132456 A1 | 6/2007 | Salman et al. | |
| 2007/0279953 A1 | 12/2007 | Hoff et al. | |
| 2008/0303528 A1 | 12/2008 | Kim | |
| 2009/0096459 A1* | 4/2009 | Yoneda | G01R 31/3651 324/430 |
| 2010/0001693 A1 | 1/2010 | Iida et al. | |
| 2011/0031048 A1 | 2/2011 | Ohkura | |
| 2011/0193413 A1* | 8/2011 | Kudo | H02J 7/0018 307/77 |
| 2014/0103934 A1 | 4/2014 | Matsui et al. | |
| 2014/0152261 A1* | 6/2014 | Yamauchi | B60L 11/1866 320/118 |
| 2014/0354291 A1* | 12/2014 | Kikuchi | H02J 7/00 324/434 |

FOREIGN PATENT DOCUMENTS

| | | |
|---|---|---|
| EP | 2 605 327 A1 | 6/2013 |
| GB | 2463145 A | 3/2010 |
| JP | 62-34082 A | 2/1987 |
| JP | 1-253177 A | 10/1989 |
| JP | 11-355904 A | 12/1999 |
| JP | 2000-58019 A | 2/2000 |
| JP | 2001-235525 A | 8/2001 |
| JP | 2005-26153 A | 1/2005 |
| JP | 2006-189436 A | 7/2006 |
| JP | 2007-85772 A | 4/2007 |
| JP | 2008-97941 A | 4/2008 |
| JP | 2009-189172 A | 8/2009 |
| JP | 2009-538112 A | 10/2009 |
| JP | 2010-63259 A | 3/2010 |
| JP | 2010-63359 A | 3/2010 |
| JP | 2011-69782 A | 4/2011 |
| JP | 2012-37464 A | 2/2012 |

OTHER PUBLICATIONS

European Search Report dated Jul. 1, 2015 (six (6) pages).
Takahashi et al., "Development of Noise Solution Type BCW for VRLA Batteries (BCW)", FB Technical News No. 63, The Furukawa Battery Co., Ltd. Nov. 2007, pp. 32-37, including partial English translation.
International Search Report dated Aug. 28, 2012 w/ English translation (four (4) pages).
Japanese-language Written Opinion (PCT/ISA/237) dated Aug. 28, 2012 (four (4) pages).
International Search Report with English translation dated Nov. 6, 2012 (5 pages).
Japanese-language Written Opinion (PCT/ISA/237) dated Nov. 6, 2012 (3 pages).
U.S. Appl. No. 14/356,798, filed May 7, 2014.
U.S. Appl. No. 14/356,778, filed May 7, 2014.
Chinese Office Action issued in counterpart Chinese Application No. 201280054874.4 dated Jun. 30, 2015 (eight (8) pages).
International Search Report dated Jan. 15, 2013 with English translation (five (5) pages).
Japanese-language Written Opinion (PCT/ISA/237) dated Jan. 15, 2013 (four (4) pages).

* cited by examiner

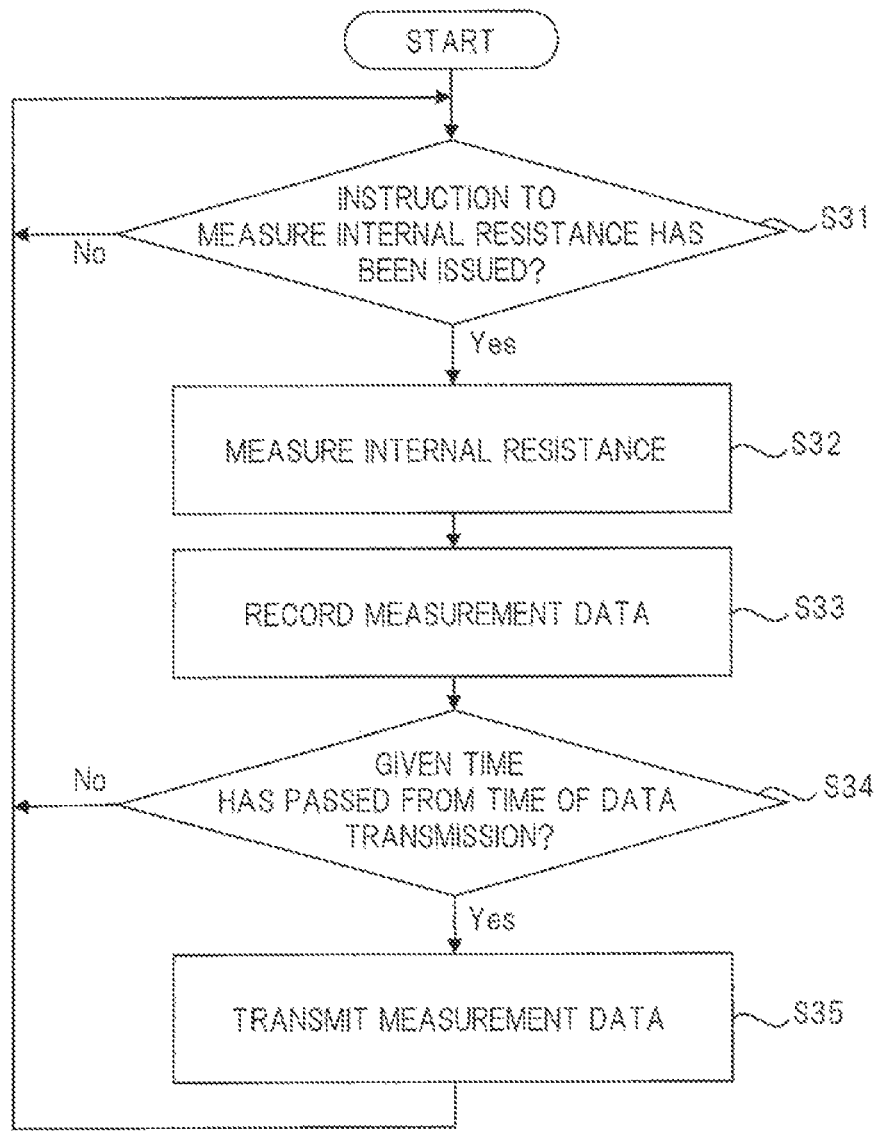

BATTERY-STATE MONITORING SYSTEM

TECHNICAL FIELD

The present invention relates to a technique for monitoring the state of a storage battery, and particularly relates to a technique effectively applied to a battery-state monitoring system which monitors and estimates the state of a storage battery which is used in a large-scale power supply system combined with a power generation facility utilizing natural energy.

BACKGROUND ART

In recent years, a power supply system composed by combining, for example, a power generator or charger utilizing natural energy such as a solar battery and a wind power generator, a storage battery, and a control system for these has been used as a self-contained power supply or a power leveling mechanism thereof. Such a power supply system is used as a single independent power supply and is sometimes operated while inputting and outputting power to/from the ordinary commercial power source in a so-called grid connection. Recently, like the so-called smart grid, the efficiency of the overall power supply is improved by the reverse power flow of the generated power to the grid in consideration of the power usage conditions in the grid and by storing the surplus power in a storage battery when the grid load is decreased and the capacity of the storage battery is decreased.

However, in the case of utilizing natural energy, the energy source is natural phenomena such as sunshine and wind conditions, and the human cannot take complete control thereof. For example, in the case of the solar power generation, power generated by the solar battery is supplied to a load while charging the storage battery with surplus power in the daytime during which sunshine is abundant, and necessary power is supplied to the load by the discharging from the storage battery in the daytime during which sunshine is scarce or the nighttime.

However, in the case of the solar battery, for example, when the sunshine in the daytime is abundant and the storage battery is kept supplied with surplus power, the storage battery may be overcharged, and it accelerates the degradation of the storage battery. Meanwhile, when sunshine is scarce, since the storage battery has to keep supplying power to the load, the storage battery may be overdischarged, and it also accelerates the degradation of the storage battery. Although the wind power generation has an advantage of receiving no direct effect from the amount of sunshine, it is difficult to maintain a constant wind velocity, and the wind power generation has characteristics that wind velocity, wind volume, and wind direction are varied by the minute.

Therefore, in order to stably operate the power supply system and power generation facility, a storage battery with a large capacity is necessary for the former case of the solar battery and a capacitor and storage battery having a large electric double layer are necessary for the latter case of the wind power generation. In addition, a storage battery is necessary also for the stable cooperation with the electrical grid, and the partially charged state referred to as PSOC (partial state of charge) of the storage battery has to be controlled within a given range.

For this reason, it is preferable to use the storage battery while constantly keeping the battery capacity within the range in which normal charging/discharging is possible. For example, Japanese Patent Application Laid-Open Publication No. 2010-63359 (Patent Document 1) describes a power supply system including a solar battery, a lead storage battery, a charge control device which charges the lead storage battery with power output from the solar battery, and a photosensor. The charge control device has a function of opening a charge circuit when the voltage of the storage battery rises to a first set voltage during the charging and closing the charge circuit to recharge the storage battery when the voltage of the storage battery drops to a second set voltage lower than the first set voltage. Also, when a charge current to the lead storage battery is equal to or smaller than a set current, the charge control device does not open the charge circuit and continues the charging even if the voltage of the storage battery rises to a voltage equal to or higher than the first set voltage, and when an illuminance value measured by the photosensor drops to a value equal to or smaller than a set value, the charge control device controls the lead storage battery to supply power to a load. In this manner, decrease in the storage battery capacity caused by insufficient charging or overdischarging of the storage battery can be suppressed.

Also, for example, Japanese Patent Application Laid-Open Publication No. 2008-97941 (Patent Document 2) describes a technique for a charge management system which manages the charging of a storage battery. The charge management system includes a discharge capacity acquiring unit which acquires a discharge capacity of the storage battery and a charging unit which charges the storage battery at a charge capacity in accordance with the discharge capacity acquired by the discharge capacity acquiring unit, and by summing up the charge and discharge currents, the storage battery can be charged at a charge capacity in accordance with the discharge capacity up to the point of time of charging.

Furthermore, for example, Japanese Patent Application Laid-Open Publication No. 2012-37464 (Patent Document 3) describes a technique for a lead storage battery and a lead storage battery system which can be used for large-scale applications including wind power generation. The lead storage battery system includes: a battery state measuring unit; an SOC (State of Charge) model; an SOC estimating unit which estimates an SOC based on measurement information obtained by the battery state measuring unit and SOC model information; an SOC transition DB in which a state of transition of the SOC of the lead storage battery is recorded; an SOC transition history managing unit which records an estimated SOC value in the SOC transition DB to check a state of transition of the SOC; a lead storage battery degradation model; a uniform charging optimum planning unit which plans a method of carrying out optimum charging of the lead storage battery based on the SOC transition state from the SOC transition history managing unit and information of the deterioration model; an SOC transition information/uniform charging information output unit; and a uniform charging control unit which carries out uniform charging of the lead storage battery in accordance with the plan determined by the uniform charging optimum planning unit, and by changing the interval of executing uniform charging of the lead storage battery in accordance with the usage conditions of the lead storage battery (transition of SOC), the service life of the lead storage battery is extended, and the frequency of uniform charging carried out merely for grasping the SOC is reduced so as to achieve a cost advantage.

PRIOR ART DOCUMENTS

Patent Documents

Patent Document 1: Japanese Patent Application Laid-Open Publication No. 2010-63359

Patent Document 2: Japanese Patent Application Laid-Open Publication No. 2008-97941

Patent Document 3: Japanese Patent Application Laid-Open Publication No. 2012-37464

SUMMARY OF THE INVENTION

Problems to be Solved by the Invention

As described above, in the power supply system using a solar battery and a storage battery in combination, the storage battery must be constantly in a state of being able to be charged or discharged normally, and the battery is preferably used in a partially charged state called PSOC (Partial State of Charge, in which SOC is, for example, 40 to 80%).

However, even when the control like this is to be realized by using the technique described in, for example, Patent Document 1, since it is difficult to estimate the accurate capacity of the storage battery, the capacity range to be used of the storage battery is limited while taking the sufficient safety margin with respect to the threshold for the SOC in the actual applications. In this circumstance, it can be concluded that the storage battery capacity is not utilized effectively and the system is not operated efficiently.

On the other hand, when the capacity of the storage battery is estimated by summing up the charge and discharge currents in accordance with the technique described in Patent Document 2, the error becomes larger as the time of summation becomes longer due to the effect of the insufficient precision of a current sensor (shunt). As a result, the estimated capacity value sometimes greatly differs from the actual storage battery capacity, and the risk of overdischarging or overcharging of the storage battery is increased.

In addition to the estimation of the storage battery capacity, the detection of the degradation of the storage battery is also important. The degradation of the storage battery greatly affects the charging and discharging characteristics and leads to the decrease in operation efficiency of the power supply system, and may render the system incapable of supplying a necessary amount of power and may exert an adverse effect on the whole system including a power supply.

For example, in the technique described in Patent Document 3, even in large-scale applications including wind power generation, the control to uniformly charge the storage battery is possible by grasping the SOC of the storage battery. In a large-scale power supply system exceeding 100 kVA and having grid connection with the commercial power source, a monitoring device connected by a conventional wiring harness method has been used from the viewpoint of reliability. In this method, however, since the chassis of the storage battery is grounded, troubles such as short circuit, smoke generation, and ignition occur due to dielectric breakdown when a line from a measuring/recording device operated by a different power supply comes in contact with a rack, which leads to a problem that a fuse has to be provided individually. Furthermore, in the case of a large-scale system exceeding 4800 VAh such as a storage battery facility defined as a fire protection facility, since the number of storage batteries connected in series is large, voltage variations between storage batteries make the operation of the system unstable in some cases.

Therefore, an object of the present invention is to provide a battery-state monitoring system capable of highly precisely and efficiently estimating the state and service life of each storage battery while suppressing the variations in voltage between storage batteries in a large-scale power supply system having a plurality of storage batteries which are charged with power generated by utilizing natural energy and are constantly connected to an equipment. Another object of the present invention is to provide a battery-state monitoring system capable of controlling each storage battery so as to operate in a given partial state of charge.

The above and other objects and novel characteristics of the present invention will be apparent from the description of the present specification and the accompanying drawings.

Means for Solving the Problems

The following is a brief description of an outline of the typical invention disclosed in the present application.

A battery-state monitoring system of a typical embodiment of the present invention is a battery-state monitoring system which monitors a state of each of a plurality of storage batteries in an equipment provided with an assembled battery composed of the storage batteries connected in series and a power generation facility utilizing natural energy, and the system has following features.

That is, the battery-state monitoring system includes: a current detecting unit which detects a current in each of the storage batteries; a state measuring unit which measures a temperature, a voltage, and internal resistance of each of the storage batteries, the internal resistance being measured by using at least two or more kinds of frequencies; and a prime monitoring unit which acquires measurement data from the state measuring unit corresponding to each of the storage batteries and issues an instruction related to an operation to the current detecting unit and the state measuring unit, and the prime monitoring unit estimates degradation of each of the storage batteries based on at least one or more values of the temperature, the voltage, and the internal resistance measured by the state measuring unit and a DC resistance of each of the storage batteries obtained from a ratio between a change in a current value detected by the current detecting unit and a change in a voltage value measured by the state measuring unit during discharging and charging of each of the storage batteries.

Effects of the Invention

The effects obtained by typical embodiments of the invention disclosed in the present application will be briefly described below.

According to a typical embodiment of the present invention, it is possible to provide a battery-state monitoring system capable of highly precisely and efficiently estimating the state and service life of each storage battery while suppressing the variations in voltage between storage batteries in a large-scale power supply system having a plurality of storage batteries which are charged with power generated by utilizing natural energy and are constantly connected to an equipment. Also, according to a typical embodiment of the present invention, it is possible to control each storage battery so as to operate in a given partial state of charge, and thus possible to prevent each storage battery from being overdischarged or overcharged.

BRIEF DESCRIPTIONS OF THE DRAWINGS

Figure 5:
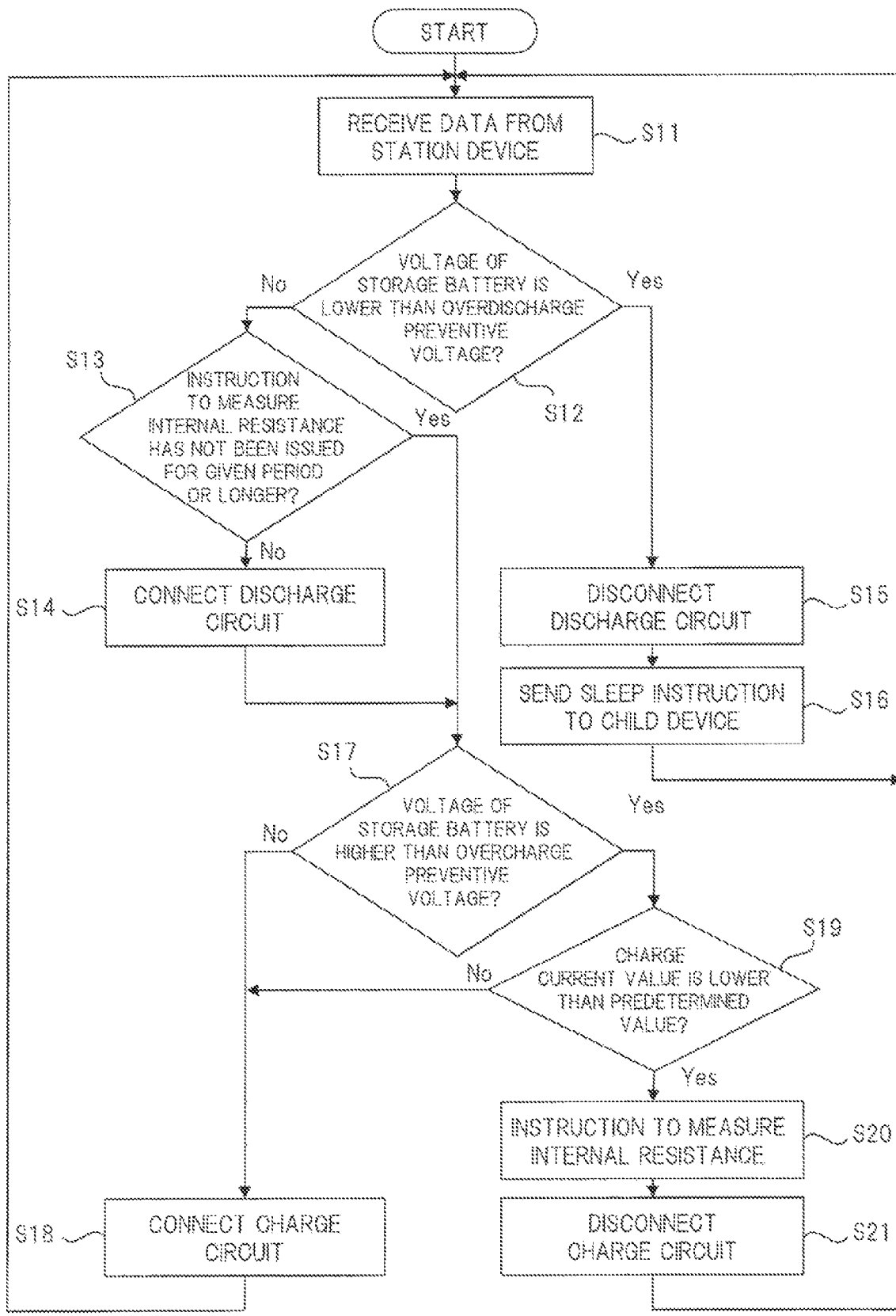

FIG. 5 is a flowchart schematically showing an example of a process of controlling charging and discharging of a storage battery by a prime monitoring device in the one embodiment of the present invention; and FIG. 6 is a flowchart schematically showing an example of a process of controlling measurement timing of internal resistance by the state measuring device (end device) in the one embodiment of the present invention.

BEST MODE FOR CARRYING OUT THE INVENTION

Hereinafter, embodiments of the present invention will be described in detail with reference to the accompanying drawings. Note that components having the same function are denoted by the same reference symbols throughout the drawings for describing the embodiments, and the repetitive description thereof will be omitted in principle.

<Summary>

As described above, a power supply system composed by combining a power generator such as a solar battery and a wind power generator and a storage battery has been used as a self-contained power supply utilizing natural energy or a power leveling mechanism. In the power supply system like this, power generated by natural energy is supplied to a load, but the power generation amount changes due to a change in the natural environment, which leads to shortage or excess in the power supply to the load. For this reason, fluctuations of the power generation amount and power supply to the load are absorbed by using the storage battery, and power supply and reverse power flow are carried out with the commercial electrical grid, thereby improving the stability and efficiency of the power supply.

Now, for example, when the storage battery is kept supplied with surplus power in an environment where sunshine is abundant or wind is strong, the storage battery is overcharged and it accelerates the degradation of the storage battery. Meanwhile, in an environment where sunshine is scarce or wind is weak, since the storage battery has to keep supplying power to the load, the storage battery is overdischarged, and it also accelerates the degradation of the storage battery. For preventing such a situation and further stabilizing the electrical grid, the electrical grid and the power system including the storage battery are cooperatively operated by carrying out the power supply and the reverse power flow with the commercial electrical grid. In order to perform the cooperative operation effectively, it is important to properly grasp the state of the storage battery.

It is known that the storage battery degrades over time even in a non-operation state and its degradation is accelerated generally when an ambient temperature is high. Therefore, in the equipment having a storage battery such as the UPS (Uninterruptible Power Source), in order to prevent the occurrence of the case in which the storage battery does not operate (discharge) normally due to the dead battery or failure, the state of the storage battery is monitored. Also, the remaining battery life is predicted in consideration of the degradation due to the ambient temperature and the service years, and the storage battery is replaced with a new storage battery before the battery reaches the predicted end of the battery life of course when the battery is in a faulty state and even when the storage battery is still in a normal state.

However, in the simple prediction of the remaining life based on the relation between the temperature and a degree of the degradation, since the precision of the prediction of the remaining life is not so high, the storage battery is replaced considerably earlier than the actual end of battery life when taking the safety margin into consideration, and the battery is not used up effectively until the actual end in some cases, so that the use is not efficient from the viewpoint of both of economical use and effective use. Furthermore, as described above, also when a threshold for the SOC (State of Charge) is set in order to use the storage battery in the given PSOC (Partial State of Charge) in the power supply system combined with a solar battery and others, the capacity range to be used of the storage battery needs to be limited while taking the sufficient safety margin.

When the state and service life of the storage battery are estimated, a more accurate estimation is possible by using various parameters in addition to the temperature. Here, when the internal resistance of the storage battery is measured, for example, a commercially available portable measuring device may be used as a simple measuring method. However, the portable measuring device is susceptible to the influence of noises generated from the power supply system or the like, and therefore has a problem in its measurement precision. In addition, when the portable measuring device is used for measurement for outdoor equipment such as electric lamps and clocks installed in the parks, the use of the portable measuring device is inefficient because separate manual measurement on the installation site is required, and it is therefore difficult to actually use the portable measuring device for such a measurement.

Hence, an apparatus or system which monitors the state of the storage batteries incorporated in a plurality of power supply systems by measuring various parameters in addition to temperature and comprehensively saves the results to intensively monitor the storage batteries is demanded. In an existing apparatus or system, the internal resistance is measured in addition to the temperature and voltage, but for more accurate estimation of the service life, increase in the number of measurement parameters such as data at the time of charging and discharging is required.

For example, a more accurate estimation of the service life in correspondence to various degradation modes of the storage battery is possible when a plurality of frequencies are used for the measurement of the internal resistance instead of using a single frequency like the case of the existing apparatus or system. Herein, although there is a device capable of measuring the internal resistance by using a plurality of frequencies while varying the measurement frequency for respective storage batteries, the application of this device to the measurement of a number of storage batteries included in the outdoor equipment is difficult in practice like the case of the portable measuring device. For simultaneously monitoring the states of a number of storage batteries, at least processing related to parameter measurement and data recording must be automated to some extent.

Therefore, the battery-state monitoring system of one embodiment of the present invention automatically measures or acquires various parameters of a plurality of storage batteries which are charged with power generated by utilizing natural energy such as a solar battery and are constantly connected to an equipment. In this manner, it is possible to highly precisely and efficiently estimate the state and service life of each storage battery and control the storage battery so as to operate properly in the given partial state of charge.

In this embodiment, each storage battery is provided with a measuring device which measures various parameters to acquire and save measurement data, and the data measured by the measuring device is transmitted to a monitoring device in response to a request through radio communication. The monitoring device comprehensively carries out the process of estimating the state and service life of the storage battery based on the measurement data collected from each measuring device, and the monitoring device has an interface through which, when there is a storage battery which needs to be replaced, the user is informed of the need of replacement of the storage battery together with related information and others.

As described above, since the power supply system designed to have the grid connection with a power supply grid is usually a large-scale system exceeding 100 kVA, the wiring harness method has been conventionally used for the connection between the monitoring device and the measuring device from the viewpoint of reliability. In this method, however, since the chassis of the storage battery is grounded, troubles such as short circuit, smoke generation, and ignition occur due to dielectric breakdown when a line of a measuring device operated by a different power supply comes in contact with a rack, which leads to a problem that a fuse has to be provided individually. Even if radio communication method is adopted, the number of measuring devices to be used is limited, and it is difficult to apply the radio communication method to a large-scale system.

Therefore, in this embodiment, in consideration of the reduction in communication loads due to that the monitoring device has communication sessions with many measuring devices and the easiness and flexibility of the installation of measuring devices resulting from utilizing radio communication, a hierarchical configuration is adopted, in which a relay device for distributing communication loads and/or converting a communication protocol is provided between the monitoring device and the measuring device. In this manner, the radio communication can be adopted as the communication method between the monitoring device and the measuring device even in a large-scale system.

In the battery-state monitoring system of this embodiment, when making a determination on the degradation of the storage battery, the degradation is determined from various aspects based on a plurality of parameters such as the voltage, internal resistance (which is mainly AC impedance and includes the battery reactance at the time of measurement, but will hereinafter be collectively referred to as "internal resistance") and DC resistance during charging and discharging in addition to the determination based on the temperature of the storage battery. For example, with regard to the temperature and voltage, as the management of the abnormal values including those caused by an unexpected fault and others, the system determines that the storage battery is in an abnormal state when the value of temperature or voltage of the storage battery acquired at a fixed interval (e.g., 5 minutes) exceeds a given threshold. Specifically, for example, when the temperature of the storage battery exceeds the room temperature by +10° C., the system determines that the storage battery is in a slight abnormal state, and when the temperature of the storage battery exceeds the room temperature by +20° C., the system determines that the storage battery is in a state where immediate replacement is needed. Also, the end of the service life may be determined based on a table or equation indicating the correlation between the temperature and the service life.

Also, as a tendency management in a normal situation, the internal resistance is measured at regular cycles such as once a day or at the time of reception of a user instruction, and the degradation of the storage battery is estimated based on the change rate from an initial value of internal resistance (e.g., an internal resistance value measured for the first time at the installation of the storage battery). For example, when the internal resistance value of the storage battery increases from its initial value by 20% or more, the system determines that the storage battery is in a slight abnormal state, when the internal resistance value increases from its initial value by 50% or more, the system determines that the storage battery needs to be replaced in an early opportunity (e.g., within a year), and when the internal resistance value increases from its initial value by 100% or more, the system determines that the storage battery must be replaced immediately. Since the absolute values of internal resistance vary depending on the type of storage batteries, determination based on relative values is carried as described above.

In this embodiment, in order to estimate the service life more accurately in correspondence to various degradation modes of the storage battery, the internal resistance is measured by using a plurality of frequencies, and the above-mentioned determination based on a relative value to the initial value is carried out for each internal resistance measured at each frequency. A conventional measuring device of an internal resistance usually uses a frequency of about 1 kHz, and it is known that the gradual degradation of the storage battery can be determined to some extent based on the internal resistance measured at this frequency. Also, since this frequency has been used widely and lots of reference data involving the frequency have been accumulated, the frequency of about 1 kHz (e.g., 350 Hz or higher to lower than 2000 Hz) is used as one of the frequencies in this embodiment.

Meanwhile, the frequency of about 1 kHz is too high as a frequency for obtaining information about a power-generating element such as an electrode reaction, and just the information merely capable of determining whether the storage battery is dead or alive can be obtained. Therefore, for obtaining more detailed information, it is preferable to measure the internal resistance at a frequency of direct current or a lower frequency close to a direct current. In this embodiment, a DC resistance component is acquired by calculating a ratio of respective changes (slope) of a current value and a voltage value during discharging based on a voltage value and a current value (larger than those at the measurement of internal resistance at AC) sequentially measured during the charging or discharging of the storage battery by the measuring devices installed for respective storage batteries. By comparing that with the initial value in the same manner as described above, the degradation of the storage battery can be determined more accurately.

However, in the above-mentioned power supply system combined with the solar battery, since charging and discharging of the storage battery are not carried out in many time zones such as the daytime in which sunshine is abundant, there is only a limited timing for measuring the DC resistance in the above-mentioned manner. For this reason, the internal resistance at low frequency is also measured in the stand-by state (in which the storage battery is not charging or discharging). For example, a frequency of lower than 100 Hz is used because the frequency brings no actual problem to the configuration of the system and does not interfere with the commercial power source (is not integer multiple of 50 Hz or 60 Hz). For the further improvement of the precision of the degradation determination, it is preferable to measure the internal resistance by using additional different frequencies.

Therefore, in this embodiment, frequencies for measuring the internal resistance include at least the high frequency of about 1 kHz (e.g., 350 Hz or higher to lower than 2000 Hz) and the low frequency of less than 100 Hz (which does not interfere with the commercial power source) and further include a middle frequency (e.g., 100 Hz or higher to lower than 350 Hz) different from those frequencies, and the internal resistance is measured by using these three kinds of frequencies as described later.

For more general description, for example, by measuring the internal resistance by using a plurality of frequencies obtained by selecting at least one or more frequencies from the low-frequency range of lower than 200 Hz and the high-frequency range of 200 Hz or higher to lower than 2000 Hz, the precision of degradation determination can be improved. The precision of degradation determination can be further improved by measuring the internal resistance by adding other frequencies selected from the above-mentioned frequency ranges.

In this manner, by determining the degradation from various aspects based on one or more parameters of a plurality of parameters including the temperature, voltage, internal resistance, DC resistance during charging and discharging and others, the state and service life of the storage battery can be estimated at high precision.

<System Configuration>

Figure 1:
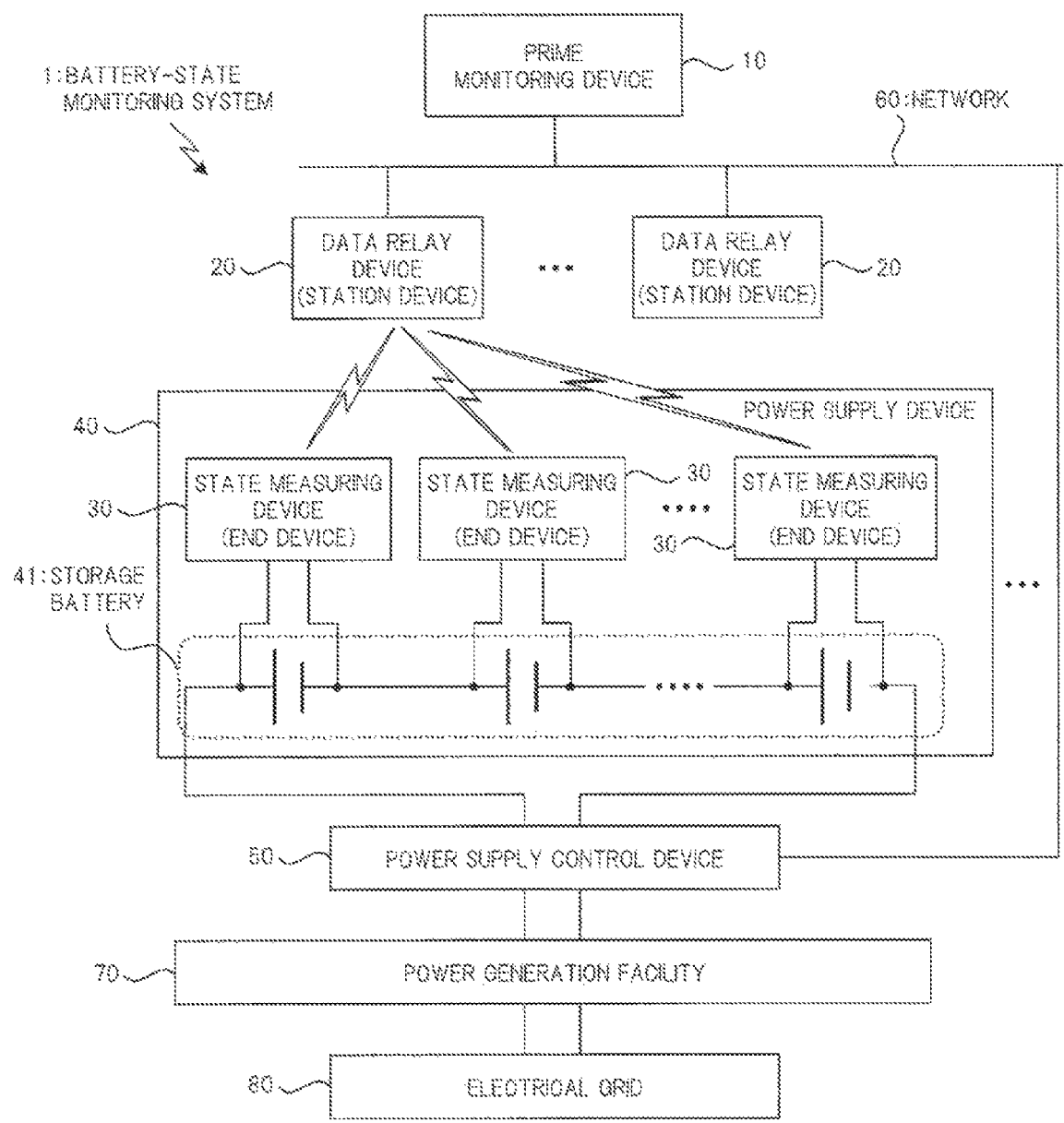
FIG. 1 is a schematic diagram of a configuration example of a battery-state monitoring system according to one embodiment of the present invention.

FIG. 1 is a schematic diagram of a configuration example of a battery-state monitoring system according to one embodiment of the present invention. In a battery-state monitoring system 1, various parameters of a plurality of storage batteries 41 connected in series and constituting an assembled battery which is incorporated in an equipment such as a power supply device 40 are automatically measured or acquired, thereby estimating the state and service life of each storage battery 41. The battery-state monitoring system 1 includes state measuring devices 30 each of which is fixedly installed to each storage battery 41 of one or more power supply devices 40 and measures various parameters of the storage battery 41 and a prime monitoring device 10 which collects measurement data from the state measuring devices 30 and comprehensively carries out a process of estimating the state and service life of the storage battery 41. The battery-state monitoring system 1 further includes data relay devices 20 which are disposed between the prime monitoring device 10 and the state measuring devices 30 and relay the measurement data transmitted from the state measuring devices 30 to the prime monitoring device 10.

More specifically, in this embodiment, the storage-battery monitoring system 1 has a three-layer hierarchical configuration in which M data relay devices 20 (which may be hereinafter referred to as "station device") are connected to one prime monitoring device 10 so as to enable communication therebetween and N state measuring devices 30 (which may be hereinafter referred to as "end device") are connected to each data relay device 20 so as to enable communication therebetween. The prime monitoring device 10 and the station devices 20 are connected by a wired communication via a network 60 such as LAN (Local Area Network), and the station devices 20 and the end devices 30 are connected by a radio communication. Standards, protocols, and others for the wired and radio communications are not particularly limited and known techniques can be used properly.

In this manner, in an equipment such as the power supply device 40 having a number of storage batteries 41, since the end devices 30 can be installed for the storage batteries 41 without providing external wirings and others, the easiness and flexibility of device installation can be improved and the devices can be installed more efficiently, so that risks of trouble caused by erroneous wire connection, time-dependent degradation of wirings and others can be reduced.

In this embodiment, each station device 20 has at least a function of converting a communication protocol between the radio communication with the end devices 30 and the wired communication with the prime monitoring device 10, but the station device 20 does not need to have other functions. The station device 20 may carry out the radio communication with each end device 30 simultaneously or sequentially. Further, depending on the scale of the battery-state monitoring system 1 (e.g., the number of storage batteries 41 to be monitored), the battery-state monitoring system 1 may have a two-layer configuration in which no station device 20 is present and the end devices 30 communicate directly with the prime monitoring device 10, and the communication between the end devices 30 and the station devices 20 (or the prime monitoring device 10) is not limited to radio communication and may be replaced with wired communication.

A power supply control device 50 which controls the operation of the power supply device 40 is connected to each power supply device 40. The power supply control device 50 is a control device including a power supply device such as power conditioning system (PCS), uninterruptible power supply (UPS), or DC power supply device. The power supply control device 50 controls whether the power to a load such as apparatus or system using the power supply device 40 is supplied from the storage battery 41 or from a power generation facility 70 described later. The power supply control device 50 controls the charging of the storage battery 41 by supplying surplus power from the power generation facility 70 to the power supply device 40 and also controls the reverse power flow to the commercial electrical grid 80.

Further, the power supply control device 50 has a function as a current detector capable of detecting a current value flowing through the storage batteries 41 connected in series in the power supply device 40, and thus can measure the current value flowing through the storage batteries 41 at the time of charging and discharging of the power supply device 40 (storage battery 41). The power supply control device 50 is connected to, for example, the network 60, and the prime monitoring device 10 can acquire the information about the current value and the presence/absence of charging and discharging of the storage battery 41 and the power generation amount of the power generation facility 70 from the power supply control device 50 via the network 60.

In the configuration of this embodiment, the power supply control device 50 detects the current value of each storage battery 41 and the prime monitoring device 10 can acquire the information from the power supply control device 50. However, the configuration is not limited thereto, and it is also possible to adopt the configuration in which the end device 30 described later measures the current value of each storage battery 41 in the same manner as the measurement of other parameters such as temperature and voltage and transmits the information thereof to the prime monitoring device 10. Also, in the configuration of this embodiment, as shown in the example of FIG. 1, the prime monitoring device 10 is provided on the network 60 so that the prime monitoring device 10 can comprehensively monitor a plurality of power supply devices 40 (end devices 30). Alternatively, it is also possible to adopt the configuration in which the function of the prime monitoring device 10 is integrated into the power supply control device 50 corresponding to each power supply device 40 so that each power supply control device 50 separately monitors each power supply device 40.

The power generation facility 70 is composed of, for example, a power generating device utilizing natural energy such as a solar power generation device (solar battery) and wind power generation device, and the power generation facility 70 is capable of generating power independently without any supply of artificially generated energy.

Figure 2:
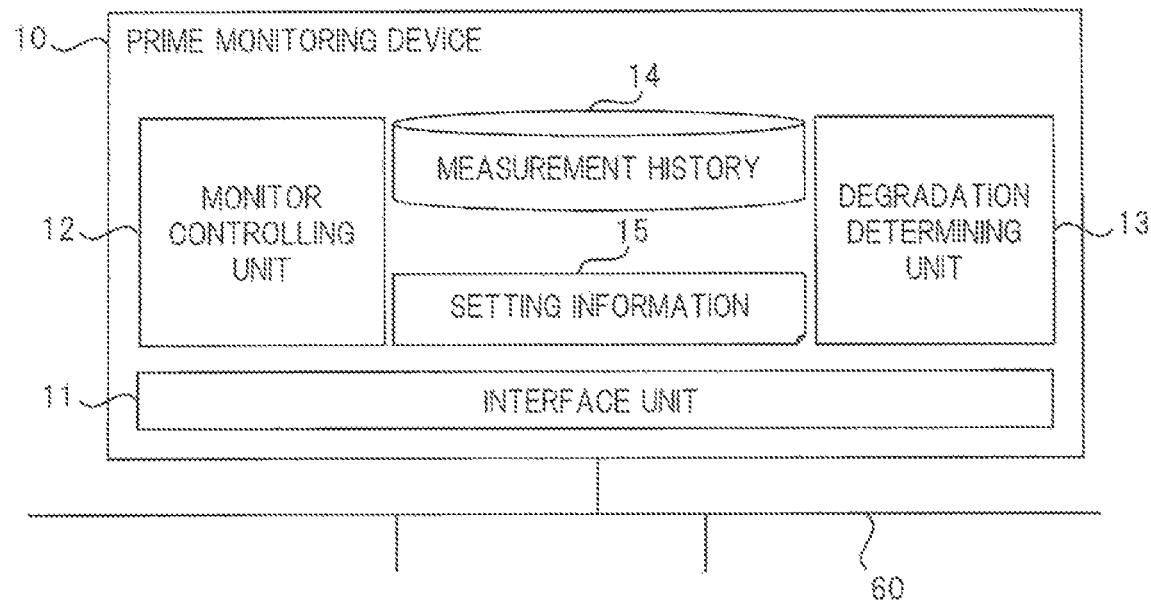
FIG. 2 is a schematic diagram of a configuration example of a prime monitoring device according to the one embodiment of the present invention.

FIG. 2 is a schematic diagram of a configuration example of the prime monitoring device 10. The prime monitoring device 10 collects information of various parameters measured with respect to each storage battery 41 from each end device 30 through the station device 20 and estimates the state and service life of each storage battery 41 based on the collected information, thereby monitoring the presence/absence of an abnormal state and the arrival of the end of its service life.

The prime monitoring device 10 is constituted of, for example, an information processing device such as a PC (Personal Computer), server or the like and includes an interface unit 11, a monitor controlling unit 12, and a degradation determining unit 13, which are incorporated as software programs running on middleware such as OS (Operating System) and DBMS (Database Management System) (not shown). Also, the prime monitoring device 10 further includes a measurement history 14 serving as a database that stores measurement data collected from the end device 30 and setting information 15 made up of files, registries and others saving various settings related to the operation of the battery-state monitoring system 1.

The interface unit 11 has a function of user interface for providing a screen with which the user inputs various instructions and a screen by which the monitoring result of the state of the storage battery 41 is displayed for the user. It is also possible to adopt the configuration in which the screen is displayed by having an access from a Web browser on the client terminal of a user by a Web server program (not shown). The various instructions input by the user include, for example, an instruction to specify operation conditions for the prime monitoring device 10 and the end device 30 that are set as the setting information 15 and an instruction to measure and collect data of the end device 30 based on a request from the user.

The monitor controlling unit 12 sends a request for specifying conditions for measurement of various parameters and executing the measurement to the end device 30 (through the station device 20) in accordance with the setting contents registered in the setting information 15 or an instruction from the user through the interface unit 11. Also, the monitor controlling unit 12 has a function of collecting measurement data by requesting the end device 30 to transmit the measurement data of various parameters and accumulating the measurement data of each storage battery 41 by recording the data in the measurement history 14.

When there are a number of storage batteries 41 to be monitored by the instruction from the user, for example, if a data measurement instruction is sent simultaneously to the end devices 30, the end devices 30 carry out the measurement for the storage batteries 41 simultaneously. Since the end device 30 applies an electric power to the storage battery 41, though it is minute, at the time of the measurement of parameters, the voltage drop occurs, and it may therefore exert an adverse effect on the power supply device 40 if a number of end devices 30 simultaneously carry out the measurement. Also, when a transmission request of measurement data is sent simultaneously to the end devices 30, the end devices 30 transmit the measurement data simultaneously to the prime monitoring device 10 through the station devices 20, with the result that a large communication load may be applied on the station device 20 and the prime monitoring device 10.

Therefore, in this embodiment, when instructions to measure various parameters (in particular, measurement of the internal resistance), transmit the measurement data and others are sent to the end devices 30 by the user, the end devices 30 are divided into groups each consisting of a proper number of end devices 30 (e.g., 30% of the entire end devices 30), and the instruction is sent automatically or manually to each group of the end devices 30 with sufficient time differences so that timings of processing by the end devices 30 belonging to respective groups do not overlap each other.

Also, in order that the monitor controlling unit 12 controls the discharging of the storage battery 41 and the charging from the power generation facility 70 based on the voltage data in the collected measurement data so that the storage battery 41 operates in the given partial state of charge, the monitor controlling unit 12 sends an instruction to the power supply control device 50 of the power supply device 40 according to, for example, a procedure described below.

The degradation determining unit 13 estimates the state and service life of the storage battery 41 by determining the degradation of the storage battery 41 from various aspects by the above-mentioned method in accordance with the setting contents registered in the setting information 15 or an instruction from the user through the interface unit 11 based on the measurement values of various parameters such as the temperature, voltage, internal resistance and others collected from the end devices 30 and recorded in the measurement history 14 and the current values and others at the time of charging and discharging in the power supply device 40 acquired from the power supply control device 50.

In this embodiment, as described later, the degradation of the storage battery 41 is estimated at mainly two timings. Firstly, the abnormality including an unexpected failure and the service life of the storage battery 41 are estimated based on acquired data of the temperature and voltage measured consecutively at fixed time intervals (short interval of 5 minutes or long interval of one day in this embodiment). Secondly, the degradation tendency of the storage battery 41 in a plurality of degradation modes is estimated based on the measurement values of internal resistance measured by using a plurality of frequencies in the state where the voltage of the storage battery 41 is higher than a predetermined overcharge preventive voltage and a charge current value is lower than a predetermined value, that is, at the timing at which it is determined that there is a possibility that the storage battery 41 is degraded.

Furthermore, the degradation tendency of the storage battery 41 may be estimated at higher precision at the timing of discharging or charging of the storage battery 41 based on DC resistance calculated from measurement data of the voltage at the discharging or charging and a DC current value at the discharging or charging acquired from the power supply control device 50. The initial values of the internal resistance and DC resistance may be acquired from the first measurement data of the storage battery 41 to be measured in the measurement history 14 or may be separately recorded for each storage battery 41.

When it is determined as a result of the estimation of the state and degradation of the storage battery 41 that the end of service life of the storage battery 41 has arrived or the storage battery 41 must be replaced because the end of its service life is near, for example, the determination is imparted together with information of measurement data, estimation result, and others to the user through the interface unit 11.

In the setting information 15, as setting contents related to the operation of the battery-state monitoring system 1, for example, an interval of measurement of the temperature and voltage by the end device 30 (e.g., every 5 minutes and once a day), an interval of measurement of the internal resistance (e.g., once a day) and others may be set or changed by the user, administrator and others. In addition, conditions of the operation mode of the end device 30 (normal mode, power-saving mode) and the like may also be set as the setting information 15.

By saving the settings related to the operation of the end device 30 in the setting information 15 of the prime monitoring device 10 so as to make it possible to specify the settings to the end device 30 from the monitor controlling unit 12, separate works to a number of end devices 30 become unnecessary, and operation conditions of the end devices 30 can be specified and changed efficiently by an instruction from the prime monitoring device 10.

Figure 3:
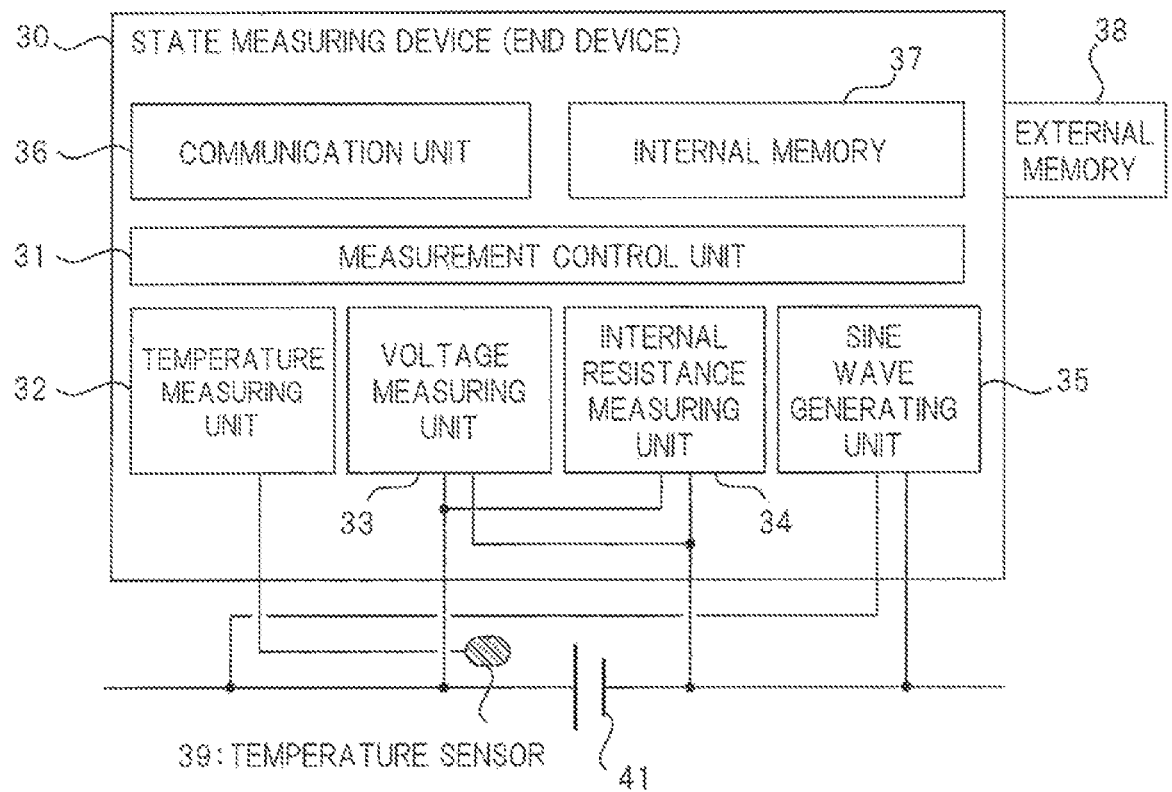
FIG. 3 is a schematic diagram of a configuration example of a state measuring device (end device) according to the one embodiment of the present invention.

FIG. 3 is a schematic diagram of a configuration example of the state measuring device (end device) 30. One end device 30 is fixedly installed to a lid or the like of one storage battery 41, measures and records various parameters of the storage battery 41, and transmits measurement data to the prime monitoring device 10 through the station device 20 in response to an instruction from the prime monitoring device 10 through the station device 20. Since the end device 30 is fixedly installed to the storage battery 41, wiring connection with the terminals, sensors and others for measuring various parameters can be stabilized, and the variations in measurement data can be reduced.

Usually, one end device 30 is installed to one storage battery 41, but depending on the cost and the voltage of the storage battery 41, some storage batteries 41 connected in series may be collectively monitored by one end device. For example, the large-scale power supply system like that of this embodiment may have the configuration in which one end device is installed to monitor 3 to 6 storage batteries connected in series, a mono-block of 6 V/12 V, or one series unit. In this configuration, a wiring harness around the end device can be shortened as much as possible, and a problem of dielectric breakdown and others can be avoided.

The end device 30 includes a measurement control unit 31, a temperature measuring unit 32, a voltage measuring unit 33, an internal resistance measuring unit 34, and a sine wave generating unit 35, which are incorporated as software programs executed by a CPU (Central Processing Unit), circuits, and others. Also, the end device 30 further includes a communication unit 36 which carries out radio communication with the station device 20 and an internal memory 37 which is a memory device composed of a nonvolatile semiconductor memory or the like. Furthermore, a temperature sensor 39 extended from the temperature measuring unit 32 is disposed on the storage battery 41, and terminals extended from the voltage measuring unit 33, internal resistance measuring unit 34, and sine wave generating unit 35 are connected to the positive and negative terminals of the storage battery 41, respectively. Note that the power to operate the end device 30 is supplied from the storage battery 41. Therefore, it is preferable that the end device 30 has a power-saving mode or the like in which the end device 30 sleeps so as not to consume power unnecessarily except a time when power is required for operating each unit.

The measurement control unit 31 has a function of controlling entire processing in the end device 30 such as the measurement of various parameters in the end device 30 and recording and transmission of measurement data. Each measuring unit constantly monitors the storage battery 41 (e.g., intervals of every 5 minutes and once a day) and sequentially records the measurement data in a given area of the internal memory 37. At this time, old measurement data is overwritten to use the area cyclically. Also, the communication unit 36 carries out radio communication with the station device 20, and measurement data is transmitted to the prime monitoring device 10 through the station device 20 based on an instruction from the prime monitoring device 10 sent through the station device 20. Measurement data recorded in the internal memory 37 can be taken out by copying or transferring it to an external memory 38 composed of a semiconductor memory or the like attached to the end device 30. Also, the external memory 38 may be used as a memory area equivalent to the internal memory 37.

The temperature measuring unit 32 measures the temperature of the storage battery 41 by using the temperature sensor 39 and outputs the measurement data to the measurement control unit 31 in accordance with an instruction from the measurement control unit 31 (e.g., every 5 minutes). Similarly, the voltage measuring unit 33 measures a voltage between the terminals of the storage battery 41 and outputs the measurement data to the measurement control unit 31 in accordance with an instruction from the measurement control unit 31 (e.g., every 5 minutes).

The internal resistance measuring unit 34 measures internal resistance between the terminals of the storage battery 41 and outputs the measurement data to the measurement control unit 31 in response to an instruction from the measurement control unit 31. In this measurement, the sine wave generating unit 35 generates sine waves of a plurality of frequencies as described above and current (e.g., 3 A or less) at respective frequencies is applied to the storage battery 41. Based on the measurement data of the current value at that time and the voltage value between the terminals, the internal resistance at respective frequencies is calculated.

As described above, for example, the precision of the degradation determination can be improved by measuring the internal resistance by using a plurality of frequencies obtained by selecting one or more frequencies from the low-frequency range of lower than 200 Hz and the high-frequency range of 200 Hz or higher to lower than 2000 Hz, respectively. By measuring the internal resistance by adding other frequencies in the above-mentioned frequency ranges, the precision can be further improved. In this embodiment, for example, three kinds of frequencies selected from the high-frequency range of about 1 kHz (e.g., 350 Hz or higher to lower than 2000 Hz, preferably 800 Hz or higher to lower than 1200 Hz) and the low-frequency range of lower than 100 Hz (which does not interfere with the commercial power source) and further the middle-frequency range (e.g., 100 Hz or higher to lower than 350 Hz) different from those frequency ranges are used to measure the internal resistance.

In order to confirm the effects obtained by the measurement using a plurality of frequencies, an example of experimental results is shown in a table below. In this example, the internal resistance of storage batteries is actually measured and the service life thereof is evaluated (battery capacity is estimated) for the respective cases in which the conventional measuring device of internal resistance (which measures the resistance by using a single frequency) is used and in which the state measuring device 30 of this embodiment (in which the internal resistance measuring unit 34 measures the resistance by using a plurality of frequencies) is used.

TABLE 1

| Items | | Conventional Product 1 | | Conventional Product 2 | | Conventional Product 3 | | Developed Product 1 | | Developed Product 2 | |
|---|---|---|---|---|---|---|---|---|---|---|---|
| Measuring Conditions | High-Frequency Range | 350~2000 Hz | | | | | | 200~2000 Hz | | 350~2000 Hz | |
| | Middle-Frequency Range | | | 100~350 Hz | | | | | | 100~350 Hz | |
| | Low-Frequency Range | | | | | 0~100 Hz | | 0~200 Hz | | 0~100 Hz | |
| | | Relative Ratio of Actual | | Relative Ratio of Estimated | | Relative Ratio of Estimated | | Relative Ratio of Estimated | | Relative Ratio of Estimated | | Relative Ratio of Estimated |
| | Battery Type | Capacity(%) | | Value(%) | | Value(%) | | Value(%) | | Value(%) | | Value(%) |
| | | 5HR | 1CA | 5HR | 1CA | 5HR | 1CA | 5HR | 1CA | 5HR | 1CA | 5HR | 1CA |
| Battery Type, Actual Capacity and Estimated Value | Battery A | 100 | 100 | 105 | 98 | 105 | 105 | 95 | 105 | 100 | 100 | 100 | 100 |
| | Battery B | 90 | 95 | 95 | 90 | 100 | 100 | 100 | 100 | 90 | 95 | 90 | 95 |
| | Battery C | 95 | 75 | 90 | 95 | 80 | 80 | 80 | 80 | 95 | 80 | 95 | 75 |
| | Battery D | 80 | 40 | 85 | 80 | 60 | 60 | 50 | 50 | 80 | 45 | 80 | 40 |
| | Battery E | 100 | 85 | 95 | 100 | 90 | 90 | 90 | 90 | 100 | 80 | 100 | 85 |
| | Battery F | 95 | 60 | 90 | 95 | 70 | 70 | 70 | 70 | 100 | 60 | 95 | 60 |
| | Battery Type | Relative Ratio of Actual Capacity(%) | | Error from Actual Capacity | | Error from Actual Capacity | | Error from Actual Capacity | | Error from Actual Capacity | | Error from Actual Capacity(%) | |
| | | 5HR | 1CA | 5HR | 1CA | 5HR | 1CA | 5HR | 1CA | 5HR | 1CA | 5HR | 1CA |
| Battery Type and Error between Actual Capacity and Estimated Value | Battery A | 100 | 100 | 5 | 2 | 5 | 5 | 5 | 5 | 0 | 0 | 0 | 0 |
| | Battery B | 90 | 95 | 5 | 5 | 10 | 5 | 10 | 5 | 0 | 0 | 0 | 0 |
| | Battery C | 95 | 75 | 5 | 20 | 15 | 5 | 15 | 5 | 0 | 5 | 0 | 0 |
| | Battery D | 80 | 40 | 5 | 40 | 20 | 20 | 30 | 10 | 0 | 5 | 0 | 0 |
| | Battery E | 100 | 85 | 5 | 15 | 10 | 5 | 10 | 5 | 0 | 5 | 0 | 0 |
| | Battery F | 95 | 60 | 5 | 35 | 25 | 10 | 25 | 10 | 5 | 0 | 0 | 0 |
| Applicability of Each Item | Error Subtotal | | | 30 | 117 | 85 | 50 | 95 | 40 | 5 | 15 | 0 | 0 |
| | Error Total | | | 147 | | 135 | | 135 | | 20 | | 0 | |
| | Measurement Time | | | 100 | | 500 | | 2500 | | 500 | | 300 | |
| | Evaluation Score (Time + Error × 10) | | | 1570 | | 1850 | | 3850 | | 700 | | 300 | |
| | Evaluation | | | Normal | | Inferior | | Inapplicable | | Good | | Excellent | |

The table 1 indicates the results of evaluation of the measurement precision based on the error between the actual battery capacity and the estimated battery capacity and the time required for the measurement obtained by measuring the internal resistance of the storage batteries having different degradation states and estimating the battery capacities thereof by using the conventional products 1 to 3 and the developed products 1 and 2.

Here, the conventional products 1 to 3 are the measuring devices each of which measures the internal resistance by using a single frequency according to the conventional technique, and the measurement frequencies of these measuring devices belong to the respectively different ranges (high-frequency range (350 Hz or higher to lower than 2000 Hz), middle-frequency range (100 Hz or higher to lower than 350 Hz) and low-frequency range (lower than 100 Hz)). Meanwhile, the developed products 1 and 2 are the state measuring devices 30 of this embodiment, and they measure the internal resistance by using measurement frequencies which belong to a plurality of frequency ranges (high-frequency range (200 Hz or higher to lower than 2000 Hz) and low-frequency range (lower than 200 Hz) for the developed product 1 and high-frequency range (350 Hz or higher to lower than 2000 Hz), middle-frequency range (100 Hz or higher to lower than 350 Hz) and low-frequency range (lower than 100 Hz) for the developed product 2).

Six types of storage batteries (batteries A to F) have been fabricated as storage batteries to be used in the experiments. These batteries are:

battery A that is a new battery conforming to storage battery standards UP300-12 (12 V/100 Ah/5 HR);

battery B fabricated by reducing the electrolytic solution of a battery equivalent to the battery A by 10%;

battery C fabricated by subjecting a battery equivalent to the battery A to a trickle charge life test conducted at 25° C. which gives the battery an effect of 5-year time-dependent degradation;

battery D fabricated by subjecting a battery equivalent to the battery A to a trickle charge life test conducted at 25° C. which gives the battery an effect of 15-year time-dependent degradation;

battery E fabricated by refilling a battery equivalent to the battery C with a decreased amount of the electrolytic solution; and battery F fabricated by refilling a battery equivalent to the battery D with a decreased amount of the electrolytic solution.

In the table, as the conditions of each of the above-mentioned batteries, based on the 5HR capacity and 1CA capacity, the actual capacities and the estimated capacity values obtained based on the measurement values of the internal resistance by the conventional products 1 to 3 and the developed products 1 and 2 are indicated by the relative ratios (%) to the full-charged capacity.

A storage battery in its fully charged state is prepared in accordance with JIS8704-02, and an actual measurement value of the discharge capacity (actual capacity) of each battery is based on the storage battery. The storage battery in its fully charged state means the storage battery charged with a limiting current of 13.38 V/10 A for 48 hours or longer. For the actual measurement value (actual capacity) of the 5HR capacity, a storage battery after being charged is left in its open-circuit state in an atmosphere of 25±2° C. for 24 hours and the battery is then discharged with a discharge current value of 20 A under a temperature of 25±2° C., and the discharge capacity is obtained from a discharge duration time required to reach its final voltage of 10.5 V. Also, for the actual measurement value (actual capacity) of the 1CA capacity, like the case of the 5HR capacity mentioned above, a storage battery after being fully charged is left in an atmosphere of 25±2° C. for 24 hours and the battery is then discharged with a discharge current value of 100 A, and the discharge capacity is obtained from a discharge duration time required to reach its final voltage of 9.6 V. The relative ratios of the obtained actual measurement values of the discharge capacity of each storage battery to the discharge capacity of a new battery are calculated.

In the estimation of the capacity based on the measurement value of an internal resistance, an experimental formula regarding the relation between the internal resistance and the discharge capacity (or discharge duration time) which is established as conventional knowledge based on accumulated experimental results is used. Specifically, since the relation between the measurement value of internal resistance and the discharge capacity is expressed by a linear function, for example, the discharge capacity obtained by each of the conventional products 1 to 3 (which measures the internal resistance by using a single frequency) is expressed by the following equation based on the measurement value of internal resistance and the initial value of internal resistance.

Discharge capacity=initial value of discharge capacity×(1−(measurement value of internal resistance−initial value of internal resistance)/initial value of internal resistance)

Therefore, the relative ratio to the discharge capacity of a new battery (initial value of discharge capacity) is calculated by the following equation.

Relative ratio=1−(measurement value of internal resistance−initial value of internal resistance)/initial value of internal resistance In the case of measuring the internal resistance by using a plurality of frequencies like the developed products 1 and 2, for example, a weighted mean value obtained by giving a predetermined weight to two or three measured internal resistance values is applied to the above-mentioned equations. For example, in the case of the measurement in the low-rate discharge, a weight heavier than that for an internal resistance measured by using a frequency in the middle-frequency range is set for an internal resistance value measured by using a frequency in the high-frequency range. Also, in the case of the measurement in the high-rate discharge, a weight heavier than that for an internal resistance measured by using a frequency in the high-frequency range is set for an internal resistance value measured by using a frequency in the middle-frequency range, and a weight heavier than that for an internal resistance value measured by using a frequency in the middle-frequency range is set for an internal resistance value measured by using a frequency in the low-frequency range.

In the table 1, for each of the conventional products 1 to 3 and the developed products 1 and 2, an error between an estimated capacity value (relative ratio) obtained based on a measurement value of internal resistance and an actual capacity (relative ratio) is determined for the 5HR capacity and 1CA capacity of each storage battery. In addition, evaluation scores are calculated based on the total of errors and times spent for the measurement of the internal resistance, and evaluation results based on the scores are indicated.

According to the evaluation results, it can be understood that the developed products 1 and 2 can estimate the battery capacity in a shorter time and at higher precision than the conventional products 1 to 3 (which measure the internal resistance by using a single frequency). It is also understood that the developed product 2 (which measures the internal resistance by using three kinds of frequencies) can estimate the battery capacity in a shorter time and at higher precision than the developed product 1 (which measures the internal resistance by using two kinds of frequencies).

<Flow of Measurement Process for Storage Battery>

Figure 4:
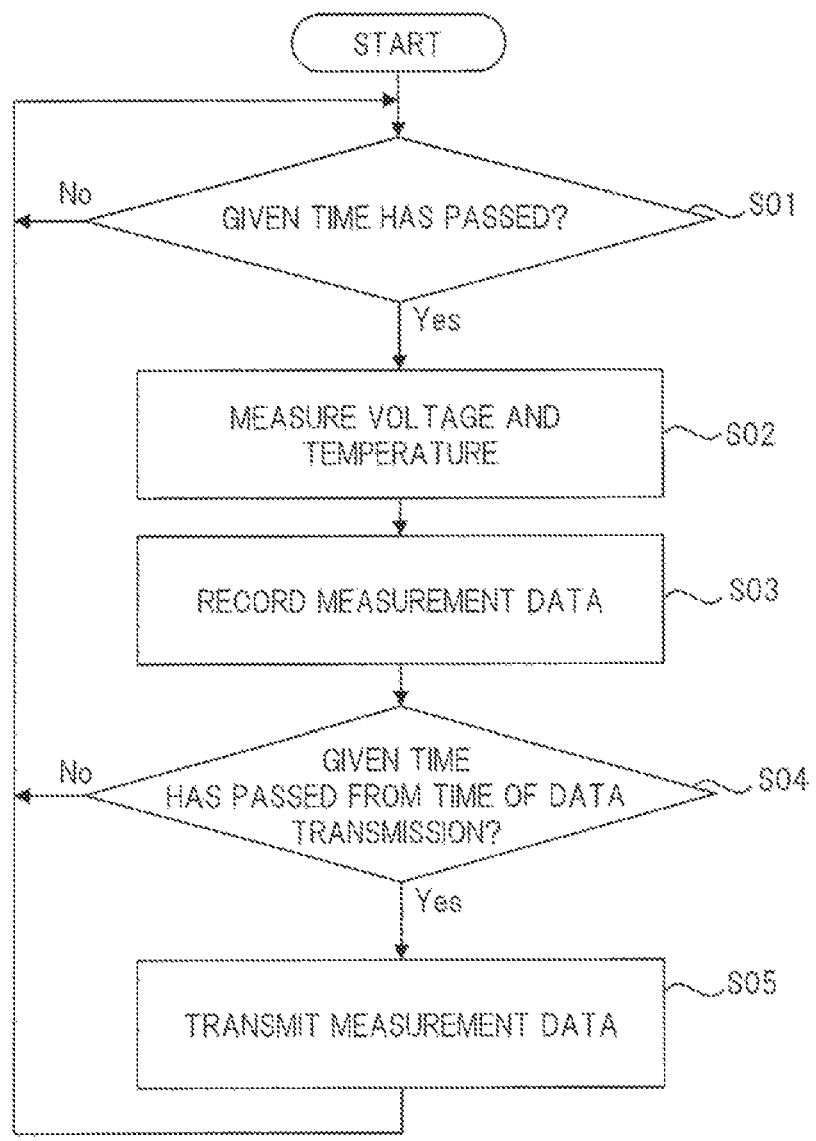
FIG. 4 is a flowchart schematically showing an example of a process of controlling measurement timing of voltage and temperature by the state measuring device (end device) in the one embodiment of the present invention.

FIG. 4 is a flowchart schematically showing an example of a process of controlling measurement timing of voltage and temperature by the measurement control unit 31 of the state measuring device (end device) 30. When the end device 30 is activated to start the measurement process of various parameters of the storage battery 41, it is first determined whether a given time has passed from the latest process (S01). This given time is an interval at which the end device 30 itself regularly measures parameters of the storage battery 41, and is set to, for example, 5 minutes when the end device 30 is not in a "sleep mode" but in a "normal mode" and to, for example, one day when the end device 30 is in the "sleep mode". The "sleep mode" in this embodiment is defined as the mode in which the frequency of measurement of the voltage and temperature by the end device 30 is decreased according to an instruction from the prime monitoring device 10 (which does not mean the stop of the end device 30).

When the given time has not passed at step S01, step S01 is repeated until the given time passes. When the given time has passed, the temperature measuring unit 32 measures the temperature of the storage battery 41 and the voltage measuring unit 33 measures the voltage between the terminals of the storage battery 41 (S02). When the temperature measuring unit 32 and the voltage measuring unit 33 finish measuring the temperature and the voltage and the measurement control unit 31 acquires the measurement data, the measurement data of the temperature and voltage is recorded together with a time stamp in the internal memory 37 (S03).

Subsequently, it is determined whether a given time has passed from the time of transmission of the measurement data to the station device (S04). For example, this given time may be the same as the given time at step S01, and can be set to the time interval of 5 minutes when the end device 30 is in the "normal mode" and to, for example, one day when the end device 30 is in the "sleep mode". When this given time has not passed, the flow returns to step S01 to repeat the above-mentioned series of process. When the given time has passed, untransmitted data out of the measurement data acquired to be recorded and stored in the internal memory 37 at step S03 is transmitted to the prime monitoring device 10 via the station device 20 (S05). After transmitting the data, the flow returns to step S01 to repeat the above-mentioned series of process. The prime monitoring device 10 estimates the abnormality including an unexpected failure and the service life of the storage battery 41 based on the received measurement data of the temperature and voltage.

FIG. 5 is a flowchart schematically showing an example of a process of controlling charging and discharging of the storage battery 41 by the prime monitoring device 10. When the prime monitoring device 10 is activated to start the control process, the prime monitoring device 10 waits until measurement data obtained by end device 30 is transmitted though the station device 20 and then receives the measurement data (S11). Next, it is determined whether a voltage indicated by voltage data of the storage battery 41 included in the measurement data is lower than a predetermined overdischarge preventive voltage (S12). At this time, as described above, the state and service life of the storage battery 41 are separately estimated by the degradation determining unit 13 based on the received measurement data.

When the voltage is not lower than the overdischarge preventive voltage at step S12, it is determined that the storage battery 41 is operating in the given partial state of charge, and it is then determined whether an instruction to measure internal resistance is issued to the power supply control device 50 corresponding to the power supply device 40 including the storage battery 41 for a given period of time or longer (S13). When the instruction to measure internal resistance has been issued within the given period of time and the measurement data of internal resistance has been acquired through the station device 20, an instruction to connect a discharge circuit to the storage battery 41 (power supply device 40) and carry out the discharging from the storage battery 41 is issued to the power supply control device 50 (S14), and then the flow proceeds to step S17. This is because it is possible to determine that the state of the storage battery 41 has no problem in this case from the fact that the state of the storage battery 41 can be estimated at the temporally close timing by the prime monitoring device 10 and the storage battery 41 operates in that state.

When the instruction to measure internal resistance is not issued for the given period of time or longer at step S13, the flow directly proceeds to step S17. The given period of time at step S13 may be defined as, for example, 1 week. Also, "connect" mentioned at step S14 (which includes other "connect" in FIG. 5 described later) includes the meaning of maintaining the connection when the storage battery 41 is already connected to the discharge circuit. When the end device 30 corresponding to the storage battery 41 is in the "sleep mode", it includes the meaning of cancelling the sleep mode.

When the voltage indicated by the voltage data is lower than the overdischarge preventive voltage at step S12, it is determined that the storage battery 41 is operating in an overdischarging state, and an instruction to disconnect the discharge circuit from the storage battery 41 (power supply device 40) and stop the discharging from the storage battery 41 is issued to the power supply control device 50 (S15). In addition, in order to avoid unnecessary measurement for the storage battery 41, an instruction to shift the end device 30 corresponding to the storage battery 41 to the "sleep mode" is issued (S16). Thereafter, the flow returns to step S11, at which the prime monitoring device 10 waits until measurement data obtained by end device 30 is transmitted though the station device 20.

On the other hand, at step S17, it is determined whether the voltage indicated by the voltage data of the storage battery 41 included in the measurement data is higher than a given overcharge preventive voltage (S17). When the voltage is not higher than the overcharge preventive voltage, it is determined that the storage battery 41 is operating in the given partial state of charge, and an instruction to connect a charge circuit to the storage battery 41 (power supply device 40) and carry out the charging to the storage battery 41 from the power generation facility 70 is issued to the power supply control device 50 (S18). Then, the flow returns to step S1, at which the prime monitoring device 10 waits until measurement data obtained by end device 30 is transmitted though the station device 20.

When the voltage is higher than the overcharge preventive voltage at step S17, it is determined that the storage battery 41 is operating in an overcharged state, and it is then determined whether the value of a charge current to the storage battery 41 acquired by the current detecting function of the power supply control device 50 is smaller than a predetermined value (S19). When the charge current value is not smaller than the predetermined value, that is, when it is determined that an internal resistance value is smaller than a predetermined value and the storage battery 41 is not so much degraded, the flow proceeds to step S18, at which an instruction to connect the charge circuit to the storage battery 41 (power supply device 40) and carry out the charging to the storage battery 41 from the power generation facility 70 is issued to the power supply control device 50.

When the charge current value is smaller than the predetermined value at step S19, that is, when it is determined that the internal resistance value is larger than the predetermined value and there is a possibility that the storage battery 41 is degraded, an instruction to measure internal resistance is issued to the corresponding end device 30 (S20). Furthermore, an instruction to disconnect the charge circuit from the storage battery 41 (power supply device 40) and stop the charging to the storage battery 41 from the power generation facility 70 is issued to the power supply control device 50 (S21). Thereafter, the flow returns to step S11, at which the prime monitoring device 10 waits until measurement data obtained by end device 30 is transmitted though the station device 20.

FIG. 6 is a flowchart schematically showing an example of a process of controlling measurement timing of internal resistance by the measurement control unit 31 of the state measuring device (end device) 30. When the end device 30 is activated to start the measurement process of various parameters of the storage battery 41, it is first determined whether the instruction to measure internal resistance at step S20 of FIG. 5 is issued from the prime monitoring device 10 to the end device 30 (S31). When the instruction to measure internal resistance is not issued, step S01 is repeated until a given time passes.

When the end device 30 has received the instruction to measure internal resistance from the prime monitoring device 10, the internal resistance of the storage battery 41 is measured by the internal resistance measuring unit 34 (S32). Here, as described above, sine waves of a plurality of frequencies are generated by the sine wave generating unit 35 and the current (e.g., 3 A or less) at each frequency is applied to the storage battery 41, and the internal resistance at each frequency is calculated based on the measurement data of the current value and the voltage value between the terminals. In this embodiment, as described above, the plurality of frequencies include at least the high frequency of about 1 kHz and the low frequency of lower than 100 Hz and may further include an additional different frequency.

When the instruction to measure the internal resistance is issued at step S20 of FIG. 5, it corresponds to the case where the voltage of the storage battery 41 is higher than the over-discharge preventive voltage. As described above, for example, in the case of the system exceeding 4800 VAh such as a storage battery facility defined as a fire protection facility, since the number of storage batteries connected in series is large, voltage variations between storage batteries 41 make the operation of the system unstable in some cases. Therefore, in this embodiment, when the voltage is higher than the predetermined threshold, including the case where the instruction to measure the internal resistance is issued at step S20 of FIG. 5, a constant current is applied through the storage battery 41 for a time slightly longer than an ordinary time (e.g., 2 to 3 seconds relative to the ordinary time of 1 second) at the time of measuring the internal resistance by an instruction from the station device or the like so that the storage battery 41 is discharged more, thereby decreasing the voltage more. In this manner, the voltages of the storage batteries 41 can be equalized by suppressing voltage variations between storage batteries 41.

In this embodiment, since a current applied through the storage battery at the measurement of the internal resistance is relatively large, this current is used to decrease the voltage. Alternatively, for example, a device which applies a constant current though the storage battery 41 to decrease the voltage (e.g., device having input characteristics that current consumption becomes smaller as battery voltage becomes smaller) may be separately provided together with the end device 30 (or may be incorporated in the end device 30). When the internal resistance measuring unit 34 measures the internal resistance and the measurement control unit 31 acquires the measurement data, the measurement data of internal resistance is recorded together with a time stamp in the internal memory 37 (S33).

Thereafter, it is determined whether a given time has passed from the time when the measurement data is transmitted to the station device (S34). This given time may be defined as, for example, 5 minutes. When the given time has not passed, the flow returns to step S31 to repeat the above-mentioned series of process. When the given time has passed, untransmitted data out of the measurement data acquired to be recorded and stored in the internal memory 37 at step S33 is transmitted to the prime monitoring device 10 via the station device 20 (S35). After transmitting the data, the flow returns to step S01 to repeat the above-mentioned series of process. At this time, as described above, the degradation tendency of the storage battery 41 in a plurality of degradation modes is separately estimated by the degradation determining unit 13 based on the measurement values of internal resistance measured by using a plurality of received frequencies.

As described above, in the battery-state monitoring system 1 of one embodiment of the present invention, various parameters of a plurality of storage batteries 41, which are charged with power generated by utilizing natural energy such as a solar battery and are constantly connected to an equipment, such as voltage, internal resistance and DC resistance during discharging and charging in addition to temperature are automatically measured or acquired, and the internal resistance is measured by using a plurality frequencies. Therefore, it is possible to highly precisely estimate the state and service life of each storage battery 41 and control the storage battery 41 so as to operate properly in a given partial state of charge.

Also, since the battery-state monitoring system 1 has the hierarchical configuration composed of the prime monitoring device 10, the station devices 20 and the end devices 30, and the station devices 20 and the end devices 30 are connected by a radio communication, various parameters of a number of the storage batteries 41 can be measured efficiently.

In the foregoing, the invention made by the inventors of the present invention has been concretely described based on the embodiments. However, it is needless to say that the present invention is not limited to the foregoing embodiments and various modifications and alterations can be made within the scope of the present invention.

INDUSTRIAL APPLICABILITY

The present invention can be applied to a battery-state monitoring system in which a state of a storage battery constantly connected to an equipment for use in backup power, output variation and others is monitored and estimated by applying electric power thereto.

DESCRIPTION OF REFERENCE SIGNS

1 Battery-state monitoring system
10 Prime monitoring device
11 Interface unit
12 Monitor controlling unit
13 Degradation determining unit
14 Measurement history
15 Setting information
20 Data relay device (station device)
30 State measuring device (end device)
31 Measurement control unit
32 Temperature measuring unit
33 Voltage measuring unit
34 Internal resistance measuring unit
35 Sine wave generating unit
36 Communication unit
37 Internal memory
38 External memory
39 Temperature sensor
40 Power supply device
41 Storage battery
50 Power supply control device
60 Network
70 Power generation facility

The invention claimed is:
1. A battery-state monitoring system which monitors a state of each of a plurality of storage batteries in an equipment provided with an assembled battery composed of the storage batteries connected in series and a power generation facility utilizing natural energy, the system comprising:
    a current detecting unit which detects a current in each of the storage batteries;
    a state measuring unit which measures a temperature, a voltage, and internal resistance of each of the storage batteries, the internal resistance being measured by using at least two or more kinds of frequencies including at least a first frequency of lower than 200 Hz and a second frequency of 200 Hz or higher to lower than 2000 Hz; and
    a prime monitoring unit which acquires measurement data from the state measuring unit corresponding to each of the storage batteries and issues an instruction related to an operation to the current detecting unit and the state measuring unit, wherein the prime monitoring unit estimates degradation of each of the storage batteries based on at least one or more values of the temperature, the voltage, and the internal resistance measured by the state measuring unit and a DC resistance of each of the storage batteries obtained from a ratio between a change in a current value detected by the current detecting unit and a change in a voltage value measured by the state measuring unit during discharging and charging of each of the storage batteries, and the prime monitoring unit applies a constant current from the state measuring unit to the storage battery whose voltage is higher than a predetermined value, thereby decreasing the voltage.

2. The battery-state monitoring system according to claim 1, comprising:
   a control unit which controls discharging from the storage battery to a load and charging to the storage battery with surplus power from the power generation facility,
   wherein the prime monitoring unit instructs the control unit to connect the storage battery to a discharge circuit to the load when a measurement value of the voltage of the storage battery acquired from the state measuring unit is equal to or higher than a predetermined overdischarge preventive voltage, and instructs the control unit to disconnect the storage battery from the discharge circuit when the measurement value of the voltage is lower than the overdischarge preventive voltage, and
   the prime monitoring unit instructs the control unit to connect the storage battery to a charge circuit from the power generation facility when the measurement value of the voltage is equal to or lower than a predetermined overcharge preventive voltage and when the measurement value of the voltage is higher than the overcharge preventive voltage and a charge current value to the storage battery detected by the current detecting unit is equal to or larger than a predetermined value, and instructs the state measuring unit to acquire a value of internal resistance of the storage battery and also instructs the control unit to disconnect the storage battery from the charge circuit when the measurement value of the voltage is higher than the overcharge preventive voltage and the charge current value to the storage battery detected by the current detecting unit is smaller than the predetermined value.

3. The battery-state monitoring system according to claim 2,
   wherein the prime monitoring unit instructs the control unit to disconnect the storage battery from the discharge circuit and also instructs the state measuring unit to extend a measurement interval of a parameter of the storage battery when the measurement value of the voltage of the storage battery acquired from the state measuring unit is lower than the overdischarge preventive voltage.

4. The battery-state monitoring system according to claim 1,
   wherein, when measuring the internal resistance of the storage battery, the state measuring unit applies a current through the storage battery, thereby decreasing the voltage of the storage battery.

5. The battery-state monitoring system according to claim 1,
   wherein the state measuring unit measures the internal resistance of the storage battery by using three kinds of frequencies including the first frequency set to be lower than 100 Hz, the second frequency set to be 350 Hz or higher to lower than 2000 Hz, and a third frequency of 100 Hz or higher to lower than 350 Hz.

6. The battery-state monitoring system according to claim 1,
   wherein, when a temperature value and/or a voltage value of the storage battery measured by the state measuring unit exceed a given value or decrease below a given value, it is determined that the storage battery has a problem, and
   degradation of the storage battery is estimated based on internal resistance of the storage battery measured by the state measuring unit and/or a change rate of a DC resistance value from an initial value during discharging of the storage battery.

7. The battery-state monitoring system according to claim 1, comprising:
   an end device composed of the state measuring unit;
   a prime monitoring device composed of the prime monitoring unit; and
   a station device which relays a communication between the prime monitoring device and the end device,
   wherein one or more station devices are connected to the prime monitoring device so as to enable communication therebetween, and
   one or more end devices are connected to each of the station devices so as to enable communication therebetween.

8. The battery-state monitoring system according to claim 7,
   wherein the communication between the station device and the end device is radio communication.

9. The battery-state monitoring system according to claim 7,
   wherein the end device measures internal resistance of the storage battery based on an instruction from the prime monitoring device sent through the station device.

10. The battery-state monitoring system according to claim 7,
    wherein the end device does not carry out transmission of measurement data through the station device to the prime monitoring device when a given time has not passed from previous transmission.

11. The battery-state monitoring system according to claim 7,
    wherein the end device is fixedly installed to the storage battery.

* * * * *